United States Patent [19]
Hocker et al.

[11] 4,447,583
[45] May 8, 1984

[54] OXIDIZED POLYACETYLENE AND A PROCESS FOR THE PREPARATION THEREOF

[75] Inventors: Jürgen Hocker, Bergisch Gladbach; Rolf Dhein, Krefeld; Rudolf Merten, Leverkusen, all of Fed. Rep. of Germany

[73] Assignee: Bayer Aktiengesellschaft, Leverkusen, Fed. Rep. of Germany

[21] Appl. No.: 387,179

[22] Filed: Jun. 10, 1982

[30] Foreign Application Priority Data

Jun. 16, 1981 [DE] Fed. Rep. of Germany ....... 3123802

[51] Int. Cl.³ .............................................. C08F 8/42
[52] U.S. Cl. ................................ 525/328.1; 525/370; 525/371; 525/372
[58] Field of Search ..................... 525/328.1, 370, 371, 525/372

[56] References Cited

U.S. PATENT DOCUMENTS 4,204,216 5/1980 Heeger et al. ........................... 537/8
4,230,604 10/1980 Wingrave ............................. 252/518
4,406,825 9/1983 Pez et al. ............................. 526/285

FOREIGN PATENT DOCUMENTS 0044935 2/1982 European Pat. Off. .
0045852 2/1982 European Pat. Off. .
71082 7/1982 European Pat. Off. .

OTHER PUBLICATIONS

Materials Research Bulletin, vol. 16, No. 10, Pergamon Press, New York, Oct. 1981.

Primary Examiner—Joseph L. Schofer
Assistant Examiner—Bernard Lipman
Attorney, Agent, or Firm—Connolly and Hutz

[57] ABSTRACT

Increasing the electrical conductivity of polyacetylene by partial oxidation (doping) with a compound of trivalent iron or of trivalent cobalt.

5 Claims, No Drawings

OXIDIZED POLYACETYLENE AND A PROCESS FOR THE PREPARATION THEREOF

This invention relates to a novel oxidised polyacetylene, to a process for the preparation thereof and to the use thereof as electrical conductors, semiconductors or photoconductors.

Polyacetylene shows specific electrical conductivities of from $10^{-9}$ to $10^{-5} \Omega^{-1} cm^{-1}$ and is thus a semiconductor [Makromol. Chem., Vol. 175, 1565 (1978)].

However, this conductivity may be considerably increased by partial oxidation. When gaseous $Cl_2$, $Br_2$, $I_2$, ICl, IBr, $AsF_5$ or $SbF_5$ is allowed to act on a polyacetylene film, the conductivity increases up to $\sim 10^3 \Omega^{-1} cm^{-1}$ [J. Amer. Chem. Soc., Vol. 100, 1013 (1978)].

Oxidation with $AgBF_4$ or $AgClO_4$ has also been proposed (J. Chem. Soc., Chem. Comm. 1978, 489). European Pat. No. 0,022,271 describes the use of metal complexes of the platinum group, carbonium or oxonium salts and parabenzoquinone derivatives to increase the electrical conductivity. The best conductivities are obtained using $I_2$ or $AsF_5$.

Most of the reagents known hitherto for increasing the electrical conductivity are either not readily accessible, toxic, corrosive, difficult to handle, sensitive to hydrolysis or readily volatile.

An object of this invention is to provide easily accessible, hardly toxic and not readily volatile substances which increase the electrical conductivity of polyacetylene.

Surprisingly, it has now been found that the electrial conductivity of polyacetylene may be greatly increased when it is partially oxidised with salts of trivalent iron or cobalt.

Thus, the present invention provides polyacetylene, the conductivity of which is increased by oxidation ("doping") with the easily accessible, hardly toxic and not volatile salts of trivalent iron or cobalt, and it also provides a process for the preparation of the partially oxidised polyacetylene and the use thereof as electrical conductors, semiconductors or photoconductors.

Suitable salts include the following: $FeF_3$, $FeCl_3$, $FeBr_3$, $FeI_3$, $Fe(ClO_4)_3$, $NH_4Fe(SO_4)_2$, $Fe(NO_3)_3$, $FePO_4$, $Fe_2(oxalate)_3$, $Fe_2(SO_4)_3$, $Fe(acetate)_3$, $Fe[(acetate)_2OH]$, $K_3[Fe(CN)_6]$, $Na_3[Fe(CN)_6]$, Fe-citrate, $Fe[2,4$-pentane-dionate$]_3$, $Na_3FeF_6$, $Fe_2C_{12}H_{48}N_{12}O_{12}S_3$=tris(ethylenediamine)iron-(III)-sulphate, $CoC_6H_{24}Cl_3N_6$=tris(ethylenediamine)cobalt-(III)-chloride, $K_3[Co(CN)_6]$, $Co[2,4$-pentanedionate$]_3$, $Co[(NH_3)_5Cl]Cl_2$ and $CoF_3$.

The halides of trivalent iron, $Fe(NO_3)_3$, $Fe[(acetate)_2OH]$ and in particular $FeCl_3$ are particularly preferred.

The salts may optionally contain water crystallisation.

Furthermore, those salts of trivalent iron or cobalt are particularly suitable which are soluble in an organic solvent or readily sublimable.

The salts which are used according to the present invention increase the conductivity of the polyacetylenes prepared according to all conventional processes. Catalyst systems which are suitable for the polymerisation of acetylene include in particular Ziegler-Natta catalysts [Polymer Journal, 2, 231 (1971)] and Luttinger catalysts [J. Org. Chem. 27, 1591 (1962)]. One catalyst system is particularly preferred which consists of from 0.05 to 0.2 mols of a vanadium compound I:

wherein
$R^1$ represents halogen (chlorine), and
$R^2$ and $R^3$ may be the same or different and represent halogen (chlorine), $OR^5$ ($R^5 = C_1 - C_{20}$ alkyl), and
from 0.1 to 4.0 mols of a trialkyl aluminium.

The polyacetylene is preferably oxidised in an organic or inorganic solvent. Suitable organic solvents include polar solvents, for example, methanol, ethanol, propanol, i-propanol, acetonitrile, acetone, dimethylformamide, N-methylpyrrolidone, sulpholane, hexamethylphosphoric acid tris-amide, nitromethane and propylene carbonate.

Water or a mixture of water with a water-miscible organic solvent is also suitable. Since polyacetylene is insoluble in all conventional solvents, oxidation is carried out in a polyacetylene suspension.

In exceptional cases, oxidation may also be carried out in the gas phase, if the oxidising agent is sublimable.

Oxidation may be carried out at from $-80°$ to $+200°$ C., preferably from $-40°$ to $+80°$ C. The reaction is particularly appropriate at room temperature.

The polyacetylene used for oxidation may be present as a fine powder, in the form of a film or as a gel.

The oxidation of polyacetylene particles is particularly preferred in the form of particles of a diameter of from 0.01 to 1 mm having a plurality of fibrous extensions ("burrs") which are obtained when acetylene is introduced into an organic suspending agent with continuous and thorough mixing, in the presence of an organometallic mixed catalyst in a quantity corresponding to from 10 to 100 mmol of aluminium and from 5 to 50 mmol of titanium tetrabutylate or from 1 to 10 mmol of bis-(2,2-dimethylpropoxy)-vanadium oxychloride per liter of suspending agent at $-80°$ C., until about 3 g of polyacetylene have formed per liter of suspending agent.

The extent of oxidation ("doping") may be controlled by the quantity of oxidising agent used, by the time of reaction and by the temperature. Thus, it is possible to control the conductivity of the partially oxidised polyacetylene between $10^{-8}$ and $10^{+2} \Omega^{-1} cm^{-1}$.

The oxidation process ("doping") is preferably carried out under an inert gas atmosphere in order to prevent the oxidation of the polyacetylene by atmospheric oxygen.

The products according to the present invention may be used as electrical conductors, semiconductors or photoconductors and for damping electromagnetic radiation (electromagnetic shielding).

In such applications the oxidised polyacetylenes according to the present invention can be used in bulk or can be added to another polymer as a "filler", thereby improving the electrical properties of the latter polymer.

Thus, for example, plastics materials, lacquers, films or fibres may be permanently provided with antistatic properties by adding the products according to the present invention.

In bulk form, the products according to the present invention may be used, for example, as an electrode material in batteries or as a component of photovoltaic transducers.

PRACTICAL EXAMPLES

Example 1

A strip of polyacetylene film according to Shirakawa [Polym. J. 4, 460, (1973)] of 0.08 g and having a specific conductivity of $2.7.10^{-7}\Omega^{-1}\,cm^{-1}$ was introduced into a solution of 1.0 g of $FeCl_3$ in 19 g of acetonitrile for 48 hours under nitrogen. The film was washed with a little acetonitrile, dried and it weighed 0.21 g. The specific conductivity of a pellet produced from the film material was $7.6.10^{-2}\Omega^{-1}\,cm^{-1}$ at a pressure of 1500 Kp/cm².

Example 2

2.5 g of $FeCl_3$ are added at room temperature and under nitrogen to 100 ml of a suspension of burr-form polyacetylene particles in acetonitrile which contains 150 mg of polyacetylene, and the mixture is stirred until the $FeCl_3$ has completely dissolved. The suspension is left for 24 hours and is filtered under suction. A partially oxidised polyacetylene film is obtained weighing 360 mg and having a specific conductivity of $6.3 \times 10^2 \Omega^{-1}\,cm^{-1}$ (measured according to the 4-point method).

We claim:

1. A process for increasing the electrical conductivity of polyacetylene, said process comprising partially oxidizing polyacetylene with a compound of trivalent iron or trivalent cobalt.

2. A process for increasing the electrical conductivity of polyacetylene, said process comprising partially oxidizing polyacetylene in a suspension thereof with a compound of trivalent iron or trivalent cobalt which is soluble in the suspending agent.

3. A process for increasing the electrical conductivity of polyacetylene, said process comprising partially oxidizing burr-form polyacetylene particles in a suspension thereof with a compound of trivalent iron or trivalent cobalt which is soluble in the suspending agent.

4. Polyacetylene having an increased electrical conductivity produced by the process of claim 1.

5. An electrical conductor, semiconductor or photoconductor made from a partially oxidized polyacetylene produced in accordance with the process of claim 1.

* * * * *